United States Patent [19]
Cooper et al.

[11] Patent Number: 5,482,602
[45] Date of Patent: Jan. 9, 1996

[54] BROAD-BEAM ION DEPOSITION COATING METHODS FOR DEPOSITING DIAMOND-LIKE-CARBON COATINGS ON DYNAMIC SURFACES

[75] Inventors: Clark V. Cooper, Glastonbury; Charles J. Isabelle, Winsted, both of Conn.

[73] Assignee: United Technologies Corporation, Hartford, Conn.

[21] Appl. No.: 148,043

[22] Filed: Nov. 4, 1993

[51] Int. Cl.$^6$ ..................................................... C23C 14/34
[52] U.S. Cl. .................... 204/192.11; 204/192.3; 204/192.16; 204/192.34; 427/523; 427/577
[58] Field of Search ................ 204/192.11, 192.15, 204/192.16, 192.29, 192.3, 192.32, 192.34, 298.04, 298.36; 427/523, 577

[56] References Cited

U.S. PATENT DOCUMENTS

| | | | |
|---|---|---|---|
| 3,961,103 | 6/1976 | Aisenberg | 427/577 X |
| 4,278,493 | 7/1981 | Petvai | 204/192.34 X |
| 4,337,990 | 7/1982 | Fan et al. | 204/192.27 X |
| 4,591,418 | 5/1986 | Snyder | 204/192.16 |
| 4,647,494 | 3/1987 | Meyerson et al. | 427/577 X |
| 4,793,908 | 12/1988 | Scott et al. | 204/192.11 X |
| 4,992,298 | 2/1991 | Deutchman et al. | 204/192.11 X |
| 5,118,400 | 6/1992 | Wollam | 204/192.11 X |
| 5,192,523 | 3/1993 | Wu et al. | 427/577 X |

Primary Examiner—Nam Nguyen
Attorney, Agent, or Firm—Terrance J. Radke

[57] ABSTRACT

One broad-beam ion deposition coating method (10) for depositing diamond-like-carbon (DLC) coatings (124) on the dynamic surfaces (120S) of articles (120) subject to adherence difficulties includes the steps of: (12) preliminarily conditioning the dynamic surface (120S) for broad-beam ion deposition; (14) inserting the article (120) in a deposition chamber (102); (16) evacuating the deposition chamber (102) to a predetermined base pressure; (18) ion sputtering conditioning of the dynamic surface (120) by ionizing an inert gas to form an ion beam (104B) having a predetermined beam current density and accelerating energy and directing the ion beam (104B) onto the dynamic surface; (20) depositing an interface layer (122) on the dynamic surface (120S) by ionizing a first gas to form an ion beam (104B) having a predetermined beam current density and accelerating energy, and directing the ion beam (104B) onto a target (118) to dislodge atoms therefrom, the dislodged atoms depositing on the dynamic surface (120S) to form the interface layer (122); and (22) depositing a DLC coating (124) on the interface layer (122) by ionizing a carbon-based gas to form an ion beam (104B) having a predetermined beam current density and accelerating energy and directing the ion beam (104B) for deposition of carbon ions (C+) onto the interface layer (122) to form the DLC coating (124) thereon.

42 Claims, 7 Drawing Sheets

BROAD-BEAM ION DEPOSITION COATING METHODS FOR DEPOSITING DIAMOND-LIKE-CARBON COATINGS ON DYNAMIC SURFACES

TECHNICAL FIELD

The present invention relates to methods for coating dynamic surfaces and articles formed thereby, and more particularly, to broad-beam ion deposition coating methods for depositing a diamond-like-carbon coating on the dynamic surfaces of an article for enhancing the frictional, hardness, and wear-resistance characteristics of such dynamic surfaces, and articles formed thereby.

BACKGROUND OF THE INVENTION

Diamond compacts and diamond-like-carbon (DLC) coatings have become an area of intense and growing development in both the scientific and industrial fields for many diverse applications, including aerospace, automotive, electronic, biomedical, and tooling. Diamond-like carbon designates dense, amorphous hydrocarbon structures embodying properties that differ markedly from those of other hydrocarbon structures, but instead have properties which in many respects resemble those of diamond. DLC coatings have a polycrystalline nature similar to that of diamond compacts which provide contact surfaces that exhibit low coefficients of friction (in contrast to monocrystalline coatings which typically exhibit a high coefficient of friction). In addition, diamond compacts and DLC coatings exhibit other diamond-like characteristics such as high wear resistance, high hardness, good corrosion resistance, chemical inertness, etc.

One major difference between diamond compacts and DLC coatings lies in the technique used to apply the compact or coating to a substrate. Diamond bodies are typically formed as micro-crystalline structures, i.e., extremely small crystals. One method of applying diamond compacts is achieved by bonding diamond grits of varying diameters, 20 microns to 1 millimeter, to the contact surface of a finished article. Bonding may be achieved by a variety of techniques. Epoxy and nickel plating techniques may be used to glue the diamond grits to the surface at temperatures in the range of 66°–260° C. (150°–550° F.) to form a surface grit layer having a thickness equivalent to the diameter of the diamond grits. Brazing and vitreous sintering techniques may also be used, with diamond grits being mixed in a matrix of powdered brazing metals or powdered glass. Braze-bonding requires temperatures in the range of 870°–980° C. (1600°–1800° F.) while vitreous bonding requires temperatures approaching 1090° C. (2000° F.). In general, diamond compacts provided by the foregoing techniques exhibit poor adhesion characteristics, poor fracture toughness, and are susceptible to the development and propagation of cracks.

Diamond coatings may be applied to a contact surface by means of a chemical vapor deposition (CVD) process. One method for applying diamond coatings to a contact surface is a plasma-assisted CVD process. Hydrogen-methane gas mixtures are excited, either by DC glow discharge or microwave activation, to produce a plasma in the vicinity of contact surface. Charged carbon particles are generated by the thermal decomposition of the methane gas component of the plasma, which is at a sufficiently high temperature to facilitate tetragonal carbon-carbon bonding, resulting in the condensation of a diamond film on the contact surface. The contact surface must be heated in excess of 800° C. (1472° F.) to promote film growth via deposition rates of about 1 micro per hour. CVD processes are disadvantageous in several respects. For example, the temperatures to which the contact surface is heated may deleteriously affect the contact surface, e.g., thermal growth that distorts the contact surface and loss of temper. In addition, the presence of plasma adjacent the contact surface may cause contamination of the contact surface, leading to loss of adhesion between the diamond coating and the contact surface.

Physical vapor deposition (PVD) processes may be used to deposit DLC coatings on contact surfaces. PVD processes such as magnetron sputtering and cathodic arc deposition form a plasma in the region adjacent to the contact surface where it ionizes an amorphous material disposed on the contact surface to form the DLC coating. Like CVD processes, the presence of plasma adjacent to the contact surface may cause contamination of the contact surface, which may lead to loss of adhesion between the DLC coating and the contact surface. Hybrid thermionically assisted PVD processes wherein solid graphite is evaporated by a differentially pumped, bent electron gun and directed into an RF or DC glow discharge or saddle field fast atom beam (FAB) PVD processes wherein a hydrocarbon gas is introduced into a cold-cathode source that generates ionizing electrons which experience oscillatory trajectories under the influence of a DC field may also be utilized to deposit DLC coatings on contact surfaces. While PVD processes such as the saddle field FAB technique possess certain advantages, e.g., contact surface to be coated is shielded from the plasma, the generated beam is uncharged, the saddle field FAB technique tends to produce DLC coatings having microstructure surface irregularities (see disclosure hereinbelow) that makes such DLC coatings unsuitable for applications wherein the DLC coating frictionally interacts with a non-DLC coated countersurface.

A need exists to provide an ion deposition coating method for depositing a DLC coating on the dynamic surface of an article wherein the DLC coating exhibits enhanced adhesion characteristics, high lubricity (low coefficient of friction), high hardness, high wear resistance, and good corrosion resistance. The ion deposition coating method should facilitate the deposition of a DLC coating on the dynamic surface of articles that are subject to poor adherence as well as to those articles which offer inherently good bonding to deposited DLC coatings.

SUMMARY OF THE INVENTION

One object of the present invention is to provide broad-beam ion deposition coating methods for depositing a diamond-like-carbon (DLC) coating indirectly or directly on the dynamic surface of an article wherein the DLC coating exhibits superior adhesion characteristics.

Another object of the present invention is to provide broad-beam ion deposition coating methods for depositing a DLC coating indirectly or directly on the dynamic surface of an article wherein the DLC-coated dynamic surface exhibits high hardness, high wear resistance and enhanced corrosion resistance.

A further object of the present invention is to provide broad-beam ion deposition coating methods for depositing a DLC coating indirectly or directly on the dynamic surface of an article wherein the surface microstructure of the DLC coating is essentially featureless, i.e., smooth.

Yet a further object of the present invention is to provide a bearing assembly having the inner and outer raceways and/or the bearing elements thereof DLC-coated utilizing one of the broad-beam ion deposition coating methods according to the present invention.

Still a further object of the present invention is to provide a gear train having the faces of the gear teeth of at least one of the intermeshing gears thereof DLC-coated utilizing one of the broad-beam ion deposition coating methods according to the present invention.

Yet another object of the present invention is to provide a rolling die having the flank and land surfaces of the annular microstructures thereof DLC-coated utilizing one of the broad-beam ion deposition coating methods according to the present invention.

These and other objects are achieved by the broad-beam ion deposition coating methods according to the present invention for depositing a DLC coating indirectly or directly on the dynamic surface of an article. One broad-beam ion deposition coating method according to the present invention is operative to indirectly deposit a DLC coating on the dynamic surface of an article subject to deposited-carbon diffusion and includes the steps of: preliminarily conditioning the dynamic surface for broad-beam ion deposition; inserting the article in a deposition chamber; evacuating the deposition chamber to a predetermined base pressure; ion sputtering conditioning the dynamic surface; depositing an interface layer on the dynamic surface; and depositing a DLC coating on the interface layer of the dynamic surface.

Preliminary conditioning of the dynamic surface entails macroscopic conditioning of the dynamic surface by mechanical and/or chemical techniques. Ion sputtering conditioning is effectuated by ionizing an inert gas to form an ion beam having a predetermined beam current density and accelerating energy, and directing the ion beam onto the dynamic surface. Interface layer deposition is achieved by ionizing a first gas to form an ion beam having a predetermined beam current density and accelerating energy, and directing the ion beam onto a target to dislodge atoms therefrom. The dislodged atoms are deposited on the dynamic surface to form the interface layer thereon. The predetermined beam current density for ion sputtering conditioning and interface layer deposition is within the range of about 1.5 mA/cm$^2$ to about 3.5 mA/cm$^2$, and preferably about 2.5 mA/cm$^2$. The predetermined accelerating energy for ion sputtering conditioning and interface layer deposition is within the range of about 1.00 keV to about 1.50 keV, and preferably about 1.05 keV. The thickness of the interface layer is preferably within the range of about 0.10 μm to about 0.15 μm.

The DLC coating is deposited on the interface layer by ionizing a carbon-based gas to form an ion beam having a predetermined beam current density and a predetermined accelerating energy, and directing the ion beam for deposition of carbon ions on the interface layer to form the DLC coating thereon. The predetermined beam current density for depositing the DLC coating on the interface layer is within the range of about 1.5 mA/cm$^2$ to about 3.5 mA/cm$^2$, and preferably about 2.5 mA/cm$^2$. The predetermined accelerating energy for depositing the DLC coating on the interface layer is within the range of about 200 eV to about 1000 eV, and preferably within the range of about 450 eV to about 700 eV, and more preferably about 450 eV. The thickness of DLC coatings deposited utilizing the broad-beam ion deposition coating methods according to the present invention preferably have a thickness within the range of about 0.70 μm to about 1.50 μm.

Another broad-beam ion deposition coating method according to the present invention is operative to directly deposit a DLC coating on the dynamic surface of an article not subject to adherence difficulties and includes the steps of: preliminarily conditioning the dynamic surface for broad-beam ion deposition; inserting the article in a deposition chamber; evacuating the deposition chamber to a predetermined base pressure; ion sputtering conditioning the dynamic surface; and depositing a DLC coating on the dynamic surface as described hereinabove.

The broad-beam ion deposition coating methods according to the present invention for depositing DLC coatings indirectly or directly on the dynamic surface of an article have utility for wide variety of engineering mechanical devices and manufacturing tooling applications. DLC coatings may be deposited on the inner and outer raceways and/or bearing elements of a bearing assembly, the faces of the gear teeth of at least one of the intermeshing gears of a gear train, and the flank and land surfaces of the annular microstructures of a rolling die utilized to form detailed heat transfer surfaces in a copper sheeting workpiece which is subsequently utilized to fabricate heat exchanger tubing for air conditioners.

BRIEF DESCRIPTION OF THE DRAWINGS

A more complete understanding of the present invention and the attendant features and advantages thereof may be had by reference to the following detailed description of the invention when considered in conjunction with the accompanying drawings wherein.

DETAILED DESCRIPTION OF PREFERRED EMBODIMENTS

Figure 1A:
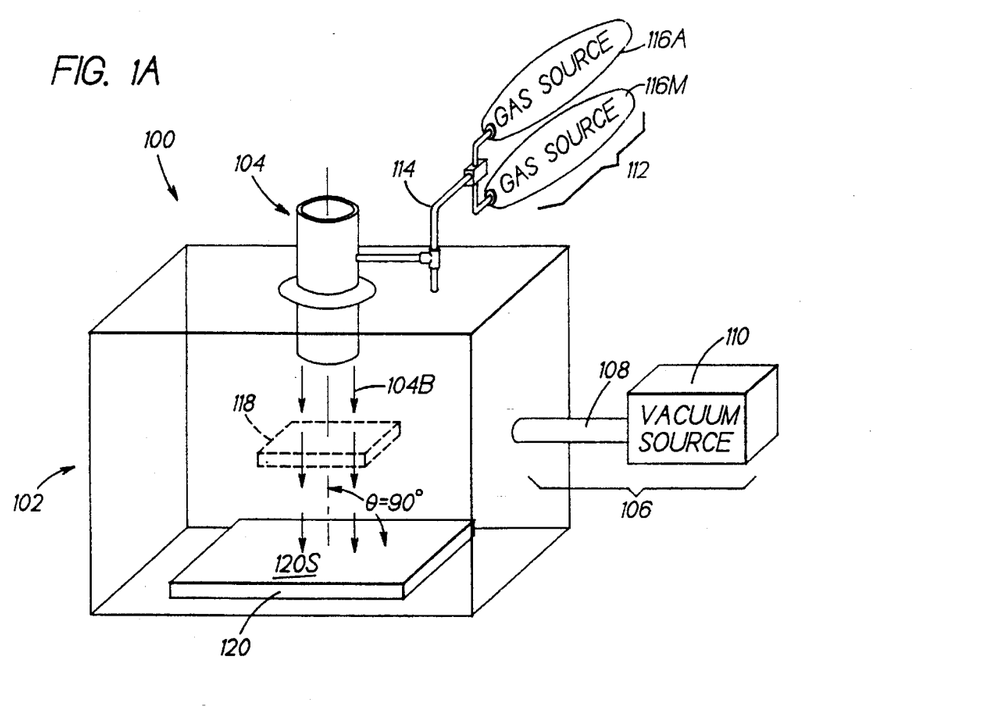
FIG. 1A illustrates an exemplary schematic embodiment of an apparatus for implementing broad-beam ion deposition coating methods according to the present invention wherein a diamond-like-carbon (DLC) layer or coating is deposited indirectly or directly on the dynamic surface of an article.
Figure 1B:
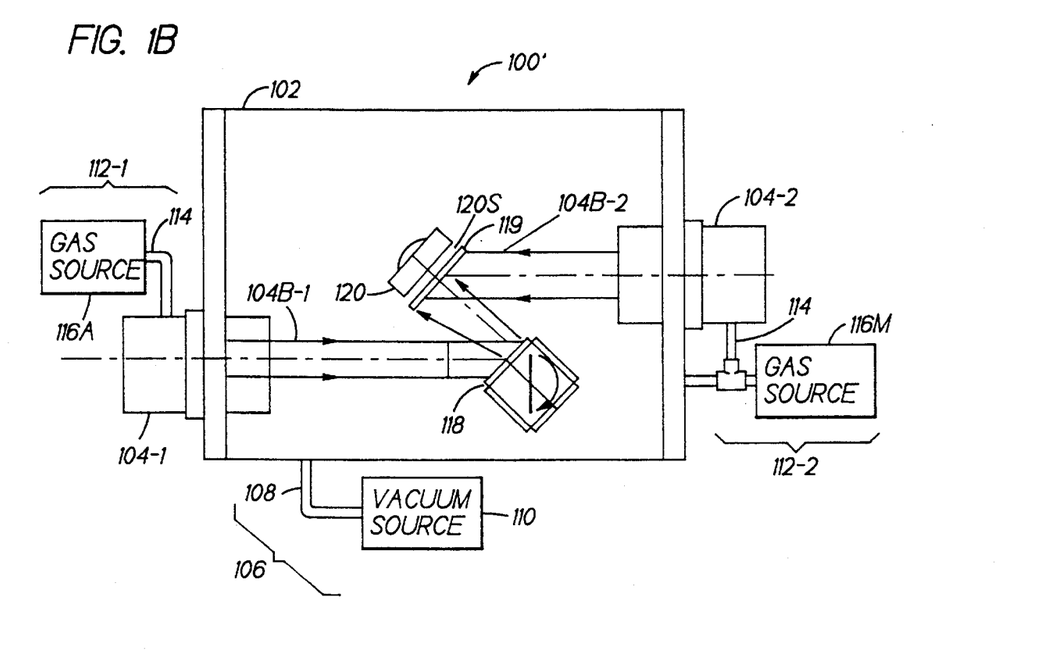
FIG. 1B illustrates another exemplary schematic embodiment of an apparatus for implementing broad-beam ion deposition coating methods according to the present invention wherein a diamond-like-carbon (DLC) layer or coating is deposited indirectly or directly on the dynamic surface of an article.

Referring now to the drawings wherein like reference characters identify corresponding or similar elements throughout the several views, FIG. 1A is schematic representation of one exemplary embodiment of an apparatus 100 for implementing broad-beam ion deposition coating methods 10 or 10' according to the present invention wherein a diamond-like-carbon (DLC) coating is deposited indirectly or directly on one or more dynamic surfaces of an article, and FIG. 1B is another exemplary embodiment of an apparatus 100' for implementing the broad-beam ion deposition coating methods 10 or 10' according to the present invention wherein a diamond-like-carbon (DLC) coating is deposited indirectly or directly on one or more dynamic surfaces of an article. The apparatus 100, 100' are configured to implement the broad-beam ion deposition processes described hereinbelow which are physical vapor deposition (PVD) processes wherein the generated plasma cloud is proximal to the broad-beam ion gun(s), i.e., distal from the dynamic surface of the article to be coated.

The apparatus 100 of FIG. 1A includes a deposition chamber 102, a broad-beam ion gun 104 that is operative to generate an ion beam 104B, a vacuum means 106, e.g., a vacuum line 108 and a vacuum pump 110, fluidically interconnected to the deposition chamber 102 and operative for evacuating the deposition chamber, a gas supply means 112, e.g., gas line(s) 114 and one or more gas sources 116, fluidically interconnected to the broad-beam ion gun 104 and the deposition chamber 102 for supplying gas thereto, and a target 118. For the broad-beam ion deposition coating methods described hereinbelow, the gas line 114 may be alternately fluidically interconnected to a first gas source 116A, e.g., argon, methane, helium, and a carbon-based gas source 116M, e.g., methane (alternatively, each individual gas source 116A, 116M may be fluidically interconnected to the broad-beam ion gun 104 and the deposition chamber 102 utilizing individual dedicated gas lines 112). The apparatus 100' of FIG. 1B includes the deposition chamber 102, first and second broad-beam ion guns 104-1, 104-2 operative to generate ion beams 104B-1, 104B2 for steps 22 and 24, respectively, a vacuum means 106, individual gas supply means 112-1, 112-2 for the respective broad-beam ion guns 104-1, 104-2, and the deposition chamber 102, the target 118, and a shutter 119.

The broad-beam ion gun 104, the vacuum means 106, and the gas supply means 112 are schematically represented inasmuch as such systems are conventional and of the type generally known to those skilled in the art. For example, the broad-beam ion gun 104 is typically a Kaufman-type broad-beam ion gun (see, e.g. FIG. 7 and the corresponding disclosure in the specification in U.S. Pat. No. 4,793,908) which is operative to ionize a supplied gas (utilizing a hot filament such that the generated plasma is adjacent the ion gun 104 and not the surface to be DLC coated) to generate an ion beam and which may be precisely regulated to accelerate the resultant ion beam at a predetermined beam current density and a predetermined accelerating energy. Since such systems are conventional and generally known to those skilled in the art, a detailed description of the mechanical and functional characteristics thereof is not included herein.

Also exemplarily illustrated in FIGS. 1A, 1B is an article 120 to have deposited thereon a DLC coating, with one dynamic surface 120S thereof positioned within the deposition chamber 102 for coating by means of the broad-beam ion deposition coating methods 10, 10' described hereinbelow. The term "articles" as used herein encompasses various types of engineering mechanical devices and/or manufacturing tooling having one or more surfaces thereof engaged in interactive rolling and/or sliding frictional contact with countersurfaces of the same device, a complementary mechanical device, or a workpiece. The interactive contact surfaces of such mechanical devices and/or manufacturing tooling are defined herein as dynamic surfaces. Such dynamic surfaces are subject to mechanical degradation due to interactive frictional contact, and are therefore, prime candidates for DLC coatings. Depending upon the complexity of the structural configuration of a given article, the article may have one or more distinct dynamic surfaces. As used herein, the term "dynamic surface" encompasses all dynamic surfaces of an article to be coated utilizing one of the broad-beam ion deposition coating methods 10 or 10' according to the present invention. By way of illustration only, which is not intended to be limiting, specific applications for the broad-beam ion deposition coating methods 10 or 10' according to the present invention include depositing DLC coatings on the inner and outer raceways (each raceway comprises a single continuous dynamic surface) of a cylindrical roller/split angular contact ball bearing combination bearing assembly (the roller/bearing combination and races are in predominately rolling frictional contact), depositing DLC coatings on the teeth (each face surface of each gear tooth comprises a single continuous dynamic surface) of a helicopter main transmission gear (the interacting gear teeth are in both rolling and sliding frictional contact), and depositing DLC coatings on the annular microstructures (the flank and land surfaces of each annular microstructure comprise a single dynamic surface) of a rolling die (tool) utilized to form detailed heat transfer surfaces in a copper sheeting workpiece which is subsequently utilized to fabricate heat exchanger tubing for air conditioners (the flank, land surfaces of the annular microstructures engage the workpiece in both sliding frictional contact (85–80% of total contact) and rolling frictional contact (15–20% of total contact)).

Figure 1C:
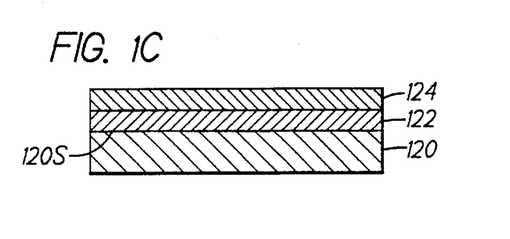
FIG. 1C is a partial cross-sectional view depicting a DLC coating indirectly deposited on an interface layer deposited on the dynamic surface of an article.
Figure 1D:
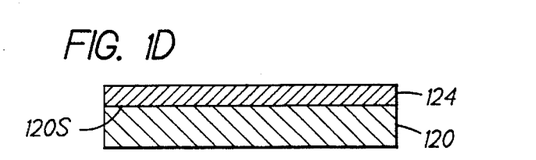
FIG. 1D is a partial cross-sectional view depicting a DLC coating directly deposited on the dynamic surface of an article.

Broad-beam ion deposition coating methods 10, 10' according to the present invention for depositing a DLC coating indirectly or directly on a dynamic surface 120S are described in the following paragraphs. The specific broad-beam ion deposition coating method 10 or 10' utilized to deposit a DLC coating on a dynamic surface 120S depends upon the material composition of the dynamic surface 120S of the article 120 to be coated. The dynamic surfaces of articles formed of certain material compositions exhibit adherence difficulties with respect to DLC coatings directly deposited thereon. For example, the dynamic surfaces of articles formed from iron, iron-based alloys, titanium, and titanium-based alloys exhibit adherence difficulties. Carbon ions deposited directly on the dynamic surfaces of such articles generally exhibit poor bonding with the dynamic surfaces or no growth. The factors which contribute to this phenomena are not well understood, but one contributing factor may be deposited-carbon diffusion. That is, carbon ions deposited directly on the dynamic surface diffuse into the article, i.e., migrate away from the near-surface region of the dynamic surface. Deposited-carbon diffusion and other factors (defined herein as "adherence difficulties) adversely affect the characteristics, especially the adhesion characteristics, of DLC coating deposited directly on the dynamic surface of such articles. It has been determined that such articles require an interface layer 122 (see FIG. 1C), i.e., a layer deposited directly on the dynamic surface 120S of the article 120, prior to deposition of the DLC coating. The DLC coating 124 is subsequently deposited on the interface layer 122, i.e., the DLC coating is indirectly deposited on the dynamic surface of the article.

The interface layer 122 is formed from a material composition that exhibits good adhesion characteristics with both the dynamic surface 120S and subsequently deposited DLC coating 124 as a result of broad-beam ion deposition, and is operative to effectively limit deposited-carbon diffusion into the article during carbon ion deposition, thereby ensuring enhanced adhesion characteristics for the subsequently deposited DLC coating. For example, acceptable material compositions for the interface layer 122 for iron, iron-based alloys, titanium, and titanium-based alloys include silicon, molybdenum, compounds based upon these and similar transition metals (columns IIIA–VIIIA, IB, and IIB of the periodic table), including, for example, titanium nitride.

Conversely, articles formed from other material compositions do not exhibit adherence difficulties with respect to deposited DLC coatings. For example, the dynamic surfaces of articles formed from silicon, aluminum, and aluminum-based alloys exhibit acceptable adhesion characteristics for DLC coatings without an interface layer.

The most critical characteristic of DLC coatings is the degree of adherence to substrates onto which the DLC coating is deposited. The broad-beam ion deposition coating methods 10, 10' according to the present invention are advantageous in providing a DLC coating deposited on the dynamic surface 120S of a article 120 that exhibits enhanced adhesion characteristics. Specific adhesion characteristics of DLC-coated dynamic surfaces 120S utilizing the DLC coating methods 10, 10' according to the present invention are described in further detail hereinbelow. Furthermore, the broad-beam ion deposition coating methods 10, 10' according to the present invention provide adhered DLC coatings having surface microstructures that are essentially featureless, i.e., exhibiting smoothness as opposed to roughness. For example, DLC coatings deposited on test specimens utilizing the broad-beam ion deposition coating method 10 according to the present invention exhibit an arithmetic-average surface microstructure roughness $R_a$ of about 12.0±3.8 nm. In contrast, DLC coatings produced by the saddle field FAB technique exhibit a morphology of regular microspheres having surface microstructure roughness values in the range of 50–100 nm. Minimization of microstructure irregularities in the DLC-coated dynamic surfaces of engineering mechanical devices and/or manufacturing tooling is extremely important inasmuch as DLC-particles are extremely hard in comparison to uncoated countersurfaces in interactive contact with DLC-coated dynamic surfaces. Interactive contact between DLC-coated dynamic surfaces exhibiting large microstructure irregularities and uncoated countersurfaces may lead to rapid degradation of such countersurfaces. The DLC coatings provided by the broad-beam ion deposition coating methods 10, 10' according to the present invention also exhibit a high degree of lubricity, i.e., low coefficient of friction, high wear resistance, good corrosion resistance (particularly in saline aqueous environments), and minimal spalling or fretting. Another advantageous feature of the broad-beam ion deposition coating methods 10, 10' according to the present invention is that the dynamic surface 120S of the articles 120 to be coated need not be subjected to high temperatures. The dynamic surface 120S of articles 120 coated utilizing the broad-beam ion deposition coating methods 10, 10' described hereinbelow experience base temperatures of less than 100° C. (about 200° F.) during the process steps comprising the method 10 or 10'. Higher base temperatures, e.g., as experienced in chemical vapor deposition coating processes, in contrast, adversely affect the article being coated and the coating, e.g., induce thermal stress in the coating, and can cause loss of temper in the article. Conversely, however, the broad-beam ion deposition coating methods 10, 10 according to the present invention provides the capability to control the temperature of the dynamic surface. In some circumstances, e.g, effecting changes in selected characteristics of the deposited DLC coating, it may prove beneficial to elevate the temperature of the dynamic surface deposition of the interface layer 122 and/or the DLC coating 124.

Figure 2:
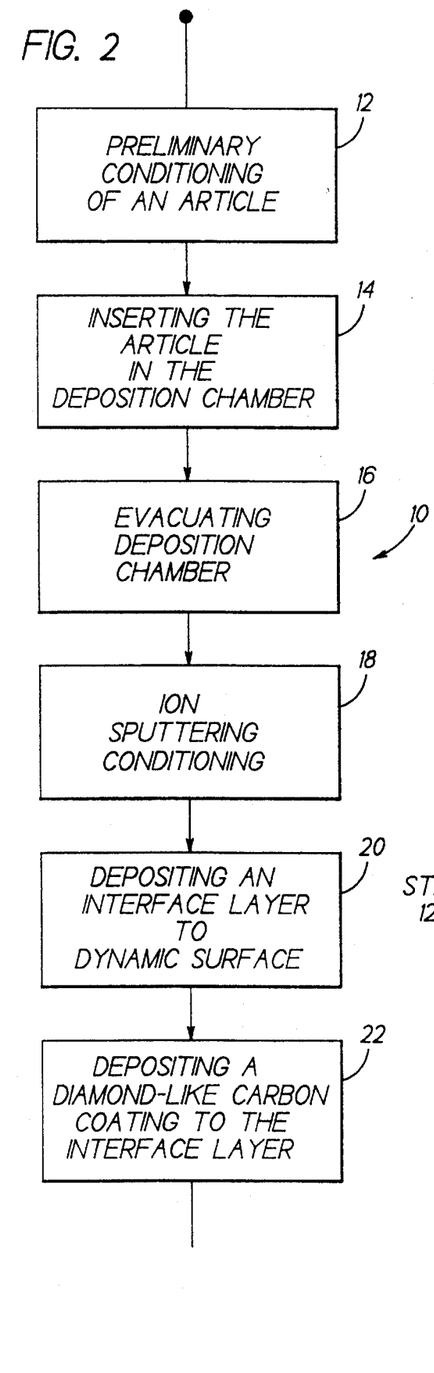
FIG. 2 is a process flow chart for one broad-beam ion deposition coating method according to the present invention illustrating the steps for depositing a DLC coating indirectly on a dynamic surface of an article which exhibits adherence difficulties.

FIG. 2 illustrates one broad-beam ion deposition coating method 10 according to the present invention for depositing a DLC coating indirectly on the dynamic surface 120S of an article 120. The method 10 is utilized where the dynamic surface 120S of the article 120 is composed of a material composition that exhibits adherence difficulties, e.g., iron, iron-based alloys, titanium, and titanium-based alloys. The broad beam ion deposition coating method 10 comprises the; steps of:

step 12—preliminarily conditioning the dynamic surface 120S of the article 120 for broad-beam ion deposition;

step 14—inserting the article 120 in deposition chamber 102 of the apparatus 100;

step 16—evacuating the deposition chamber 102;

step 18—conditioning the dynamic surface 120S for broad-beam ion deposition by ion sputtering;

step 20—depositing an interface layer 122 on the dynamic surface 120S by broad-beam ion deposition; and step 22—depositing a DLC coating 124 on the interface layer 122 by broad-beam ion deposition.

Figure 2A:
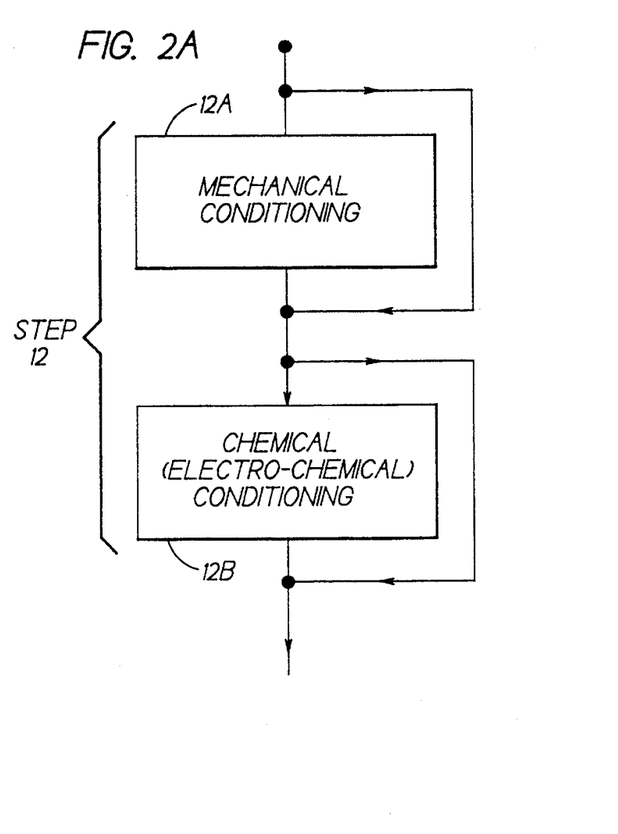
FIG. 2A depicts optional substeps for the broad-beam ion deposition coating method of FIGS. 2 or 3.

The preliminary conditioning step 12 involves one or more substeps that entail macroscopic physical, chemical, and/or electro-chemical conditioning of the dynamic surface 120S for broad-beam ion deposition of the interface layer or the DLC coating. Depending upon the structural and functional characteristics required for the dynamic surface 120S, a mechanical conditioning substep 12A may be utilized to mechanically prepare the dynamic surface 120S as illustrated in FIG. 2A. For example, the dynamic surface 120S may be mechanically polished or machine-ground, to enhance the surface finish thereof for the broad-beam ion deposition of the interface layer or the DLC coating. Further, the dynamic surface 120S may be chemically and/or electro-chemically cleaned in a substep 12B to remove contaminants therefrom by chemical reaction. For example, substep 12B may entail degreasing the dynamic surface 120S by washing thereof utilizing one or more solvents. The solvents utilized in substep 12B depend upon the nature of the contaminants to be removed, and the selection of such solvent(s) is within the general knowledge of one skilled in the art. Typically, organic solvents are utilized in substep 12B.

The inserting step 14 comprises placing the article 120 within the deposition chamber 102 and spatially orientating the dynamic surface 120S of the article 120 with respect to the trajectory of the ion beam 104B generated by the broad-beam ion gun 104 to achieve a predetermined trajectory angle θ (see, e.g., FIGS. 1A, 7) therebetween. Preferably, the dynamic surface 120S is positioned orthogonal to the ion beam 104B, i.e., trajectory angle Θ=90° (see FIG. 1A), as this spatial orientation ensures the best adhesion characteristics for broad-beam ion deposition of the DLC coating and the optimal deposition rate. Depending upon the complexity of the structural configuration of dynamic surface 120S of the article 120, however, the ion beam 104B may be non-orthogonally orientated, i.e., angled such that the trajectory angle (Θ)<90°, with respect to the dynamic surface 120S to ensure the requisite coating of the dynamic surface 120S. For example, one application for the broad-beam ion deposition coating methods 10, 10' according to the present invention involves depositing a DLC coating on the dynamic surface of a rolling die to enhance the functional characteristics thereof, e.g., increased hardness, increased wear resistance, and particularly to provide high lubricity which eliminates the need to use contaminating lubricants during the forming process since the high lubricity of a DLC-coated tool significantly reduces metal-particulate-forming forces. The rolling die must be spatially orientated at a specific trajectory angle Θ<90° (see detailed discussion hereinbelow vis-a-vis the rolling die). For dynamic surfaces 120S having a complex configuration, e.g., the rolling die, it may be necessary to reposition the dynamic surface 120S one or more times (or continually) to ensure complete coating thereof by ion beam deposition according to the methods 10, 10' of the present invention.

Next, the deposition chamber 102 is evacuated in step 16 utilizing the vacuum means (vacuum line 106, vacuum source 108) which is fluidically interconnected to the deposition chamber 102. For depositing DLC coatings on the working surfaces 120S of the articles 120 described hereinbelow utilizing the broad-beam ion deposition coating methods 10, 10' according to the present invention, the deposition chamber 102 is evacuated to a base pressure equal to or less than $3 \times 10^{-5}$ torr. In preparing DLC-coated Pyrowear 53 test specimens as described hereinbelow in further detail, the deposition chamber 102 was evacuated to a base pressure of about $2.5 \times 10^{-5}$ torr.

Pursuant to step 18, the dynamic surface 120S is microscopically conditioned in the deposition chamber 102 as a precursor to implementing the broad-beam ion deposition coating method 10 or 10' according to the present invention. Ion sputtering is utilized for the microscopic conditioning of step 18 to eliminate unwanted residue remaining after the preliminary conditioning step 12, e.g., oxides and/or contaminants that are not amenable to mechanical conditioning and/or are not soluble in solvents. In addition, ion sputtering microscopically roughens the dynamic surface 120S to facilitate subsequent ion deposition of the interface layer 122 (or the DLC coating 124 in the broad-beam ion deposition coating method 10' described hereinbelow). With respect to FIG. 1A, a sputtering gas such as argon is introduced into the broad-beam ion gun 104 utilizing the gas supply means 112 (line 114, gas source 116A) where ionization thereof is effected by means of the broad beam ion gun 104 to form Ar+. The Ar+ ions in the form of the ion beam 104B are accelerated toward the dynamic surface 120S by the broad-beam ion gun 104 where the impact energy thereof effectuates sputter cleaning of the dynamic surface 120S. With respect to FIG. 1 B, the broad-beam ion gun 104-2 is utilized for ion sputter conditioning, with the article 120 rotated so that the dynamic surface 120S thereof is perpendicular to the ion beam 104B-2. The apparatus 100' of FIG. 1B provides the further capability for ion sputtering conditioning of the target 118 prior to step 22 utilizing the broad-beam ion gun 104-1. If the target 118 is ion sputtering conditioned, the shutter 119 is operative to shield the dynamic surface 120S from any ions dislodged during the target conditioning procedure. For the described broad-beam ion deposition coating methods 10,10' according to the present invention, the broad-beam ion gun 104 utilizes an acceleration energy within the range of about 1.00 keV to about 1.20 keV, and preferably about 1.05 keV, and a beam current density within the range of about 1.5 mA/cm$^2$ to about 3.5 mA/cm$^2$, and preferably about 2.5 mA/cm$^2$. The dynamic surface 120S is conditioned for a predetermined period of time, the time period being dependent, inter alia, on the acceleration energy and the beam current density of the ion beam 104B, and the configurational complexity of the dynamic surface 120S. By way of example, the period for ion sputtering conditioning of the Pyrowear 53 test specimens was approximately 300 seconds. In addition to argon gas (which is inexpensive and works reasonably well), other inert gases such as helium may be utilized to form ions for the ion sputtering conditioning of step 18.

An interface layer 122 (see FIG. 1C) is deposited on the dynamic surface 120S in step 20. A gas such as argon (Ar) is supplied to the broad-beam ion gun 104 (the broad-beam ion gun 104-1 of FIG. 1 B) by means of the gas supply means 112 (the gas supply means 112-1 ). The supplied gas is ionized to form the ion beam 104B (the ion beam 104B-1) and accelerated towards the target 118 by the broad-beam ion gun 104 (broad-beam ion gun 104-1) The accelerating energy for step 20 is within the range of about 1.0 keV to about 1.2 keV, and preferably about 1.05 keV, and a beam current density within the range of about 1.5 mA/cm$^2$ to about 3.5 mA/cm$^2$, and preferably about 2.5 mA/cm$^2$.

The target 118 is fabricated from a material composition that exhibits good adhesion characteristics with both the material composition of the dynamic surface 120S and the subsequently deposited DLC coating 124, and that inhibits carbon ion diffusion. As disclosed hereinabove, acceptable material compositions for the target 118 for the dynamic surfaces 120S of articles 120 fabricated from iron, iron-based alloys, titanium, and titanium-based alloys include silicon, molybdenum, compounds based upon these and similar transition metals (columns IIIA–VIIIA, IB, and IIB of the periodic table), including, for example, titanium nitride. The target 118 is interposed between the broad-beam ion gun 104 (the broad-beam ion gun 104-1) and the dynamic surface 120S, i.e., in the trajectory of the ion beam 104B (ion beam 104B-1 ), so that the accelerated ions comprising the ion beam 104B (ion beam 104B-1) impact the target 118. The impact energy of the accelerated ions is sufficient to dislodge atoms from the target 118, the dislodged atoms being subsequently deposited on the dynamic surface 120S to form the interface layer 122. The interface layer 122 is operative to provide an effective diffusion barrier for the carbon ions to be deposited in step 22 to form the DLC coating. The interface layer 122 formed in step 20 should have a thickness sufficient to inhibit deposited-carbon diffusion. It has been determined that interface layers 122 having a thickness within the range of about 0.10 μm to about 0.15 µm satisfactorily inhibit deposited-carbon diffusion. Subsequent to the deposition of the interface layer 122 on the dynamic surface 120S, the target 118 of the apparatus 100 is removed from the trajectory of the ion beam 104B generated by the broad-beam ion gun 104.

The material composition of the target 118 and the partial pressure of gases in the deposition chamber 102 in combination determine the composition of the interface layer 122 deposited on the dynamic surface 120S. For example, the target 118 may be fabricated from silicon (Si) to form a silicon interface layer 122 on the dynamic surface 120S that is operative to inhibit deposited-carbon diffusion where the dynamic surface 120S of the article 120 is fabricated from material composition such as iron, iron-based alloys, titanium, or titanium-based alloys. If argon gas is supplied to the broad-beam ion gun 104 (broad-beam ion gun 104-1) in step 20, Ar+ ions are accelerated therefrom to impact the Si target 118 with sufficient impact energy to dislodge Si atoms from the Si target 118, the dislodged Si atoms possessing sufficient impact energy to be deposited on the dynamic surface 120S to form an interface layer 122 of elemental silicon (Si). If methane gas at a predetermined partial pressure is present in the deposition chamber 102 during sputtering of the silicon target 118 by Ar+ ions, the dislodged Si atoms combine with the methane gas molecules in the deposition chamber 102 and are deposited on the dynamic surface 120S to form an interface layer 122 of amorphous silicon-carbon-hydrogen, i.e., a-Si:C:H, on the dynamic surface 120S. In fabricating the Pyrowear 53 test specimens described hereinbelow, methane gas at a predetermined partial pressure of about $1.5 \times 10^{-4}$ torr was present in the deposition chamber 102.

In step 22 the DLC coating 124 is deposited on the interface layer 122. As a general rule, the deposition of the DLC coating 124 is more sensitive to process parameters, i.e., accelerating energy, beam current density, than the deposition of the interface layer 122. A carbon-based gas (as used herein, a carbon-based gas is a gas that provides carbon ions (C+) when dissociated or ionized, e.g., a hydrocarbon gas such as methane ($CH_4$) or a gas that produces hydrocarbons as a result of decomposition or reaction) is supplied to the broad-beam ion gun 104 (broad-beam ion gun 104-2) by the gas supply means 112 (gas supply means 112-2) and ionized by the broad-beam ion gun 104 (broad-beam ion gun 104-2) to provide, inter alia, a supply of carbon ions (C+). Where methane is utilized as the supply gas, the resulting carbon ions (C+) and hydrogen ions (H+) comprising the ion beam 104B (ion beam 104B-2) are accelerated toward the dynamic surface 120S by the broad-beam ion gun 104 (broad-beam ion gun 104-2). The carbon ions (C+) deposited on the interface layer 122 form the DLC coating 124 for the dynamic surface 120S. It will be appreciated that hydrogen ions (H+) are also deposited on the interface layer 122. Secondary ion mass spectrometry (SIMS) was employed to estimate the concentration of hydrogen incorporated in DLC coatings 124 deposited on a dynamic surface 120S utilizing one of the broad-beam ion deposition coating methods 10, 10' according to the present invention. SIMS results indicate that the concentration of hydrogen in such DLC coatings 124 is approximately thirty atomic percent.

The accelerating energy for step 22 should be within the range of about 200 eV to about 1000 eV, and preferably within the range of about 450 eV to about 700 eV, and more preferably about 450 eV. If the accelerating energy provided by the broad-beam ion gun 104 is too high, i.e., >about 1000 eV, the impact energy of the ions deposited onto the dynamic surface 120S will cause resputtering. That is, previously deposited ions will be ejected from the dynamic surface 120S by the impact energy of incoming ions, i.e., the high impact energy thereof. If the accelerating energy provided by the broad-beam ion gun 104 is too low, i.e., <about 200 eV, the interface layer formed by the deposited ions exhibits poor adhesion characteristics due to the low impact energy of the deposited ions. The beam current density of the generated ion beam 104B (ion beam 104B-2) should be within the range of about 1.5 mA/cm$^2$ to about 3.5 mA/cm$^2$, and preferably about 2.5 mA/cm$^2$.

The specific thickness of the DLC coating 124 is determined in part by the load forces to which the DLC-coated dynamic surface 120S is to be subjected to and in part by the type of frictional contact to which the DLC-coated dynamic surface 120s is to be subjected to. It has been determined that when the dynamic surface 120S is subjected to pure rolling frictional contact, e.g., cylindrical roller bearings, the most effective thickness for the DLC coating 124 is less than the DLC-coating thickness required when the dynamic surface 120S is subjected exclusively to sliding frictional contact. Pragmatically, however, most dynamic surfaces 120S will be subjected to an admixture of rolling and sliding frictional contact, and therefore the thickness requirement for the DLC coating 124 will be within the range defined between pure sliding frictional contact and pure rolling frictional contact. For example, the rolling die described hereinbelow is subject to about 15–20% sliding frictional contact and about 85–80% rolling frictional contact. It has been determined that DLC coatings 122 having a thickness within the range of about 0.50 µm to about 2.00 µm, and preferably within the range of about 0.70 µm to about 1.50 µm, are sufficient for most engineering device and manufacturing tooling applications.

Figure 3:
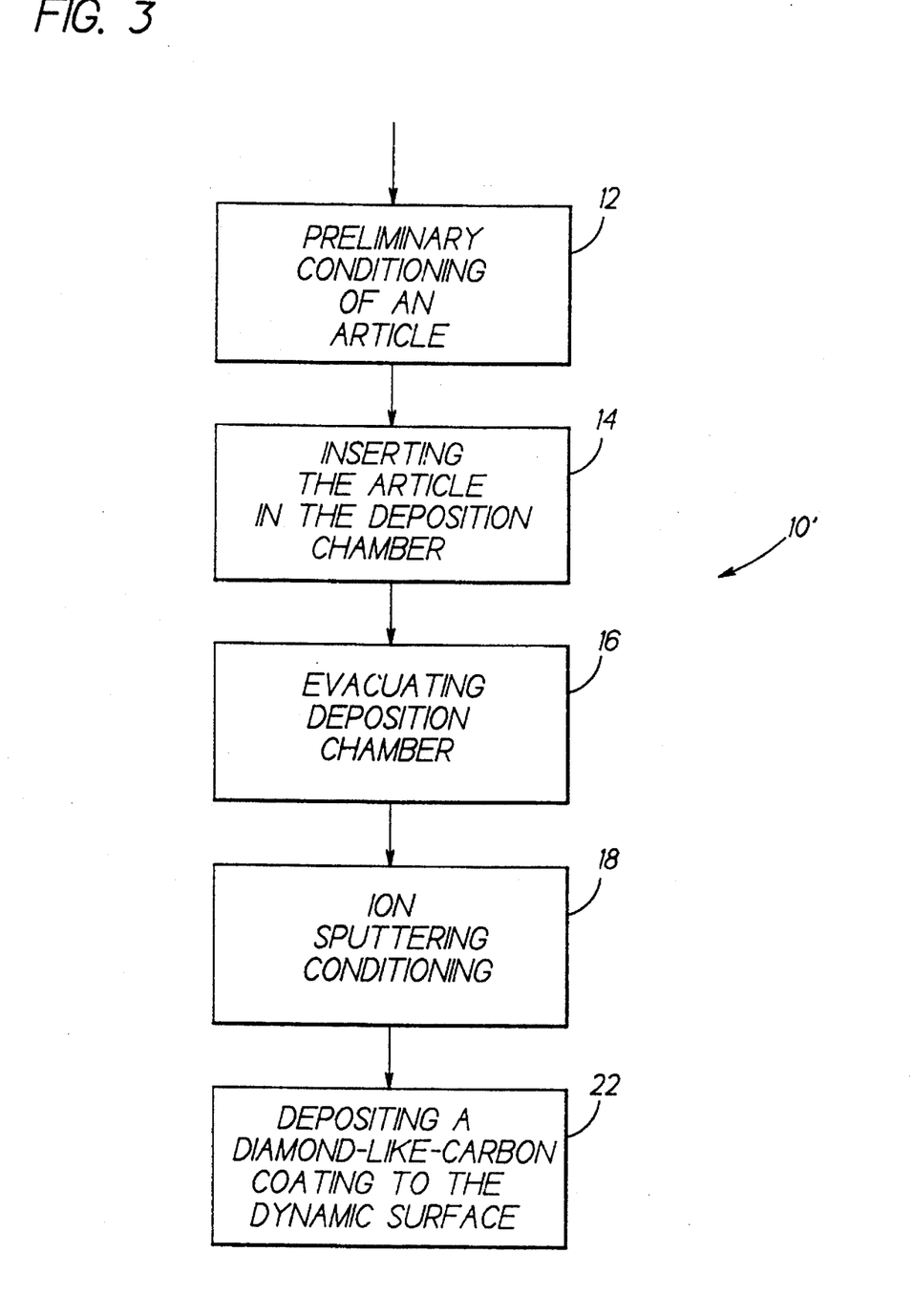
FIG. 3 is a process flow chart for another broad-beam ion deposition coating method according to the present invention illustrating the steps for depositing a DLC coating directly on a dynamic surface of an article which does not exhibit adherence difficulties.

FIG. 3 illustrates another broad-beam ion deposition coating method 10' according to the present invention for depositing a DLC coating directly on the dynamic surface of an article. The method 10' is utilized where the dynamic surface 120S of the article 120 is composed of a material composition that does not exhibit adherence difficulties, e.g., silicon, aluminum, and aluminum-based alloys. The broad beam ion deposition coating method 10' comprises the steps of:

step 12—preliminarily conditioning the dynamic surface 120S of the article 120 for broad-beam ion deposition;

step 14—inserting the article 120 in deposition chamber 102 of the apparatus 100;

step 16—evacuating the deposition chamber 102; step 18—conditioning the dynamic surface 120S for broad-beam ion deposition by ion sputtering; and step 22—depositing a DLC coating directly on the dynamic surface 120S by broad-beam ion deposition.

The foregoing steps are equivalent to the corresponding steps described hereinabove for the broad-beam ion deposition coating method 10. As will be apparent from an examination of the steps comprising the broad-beam ion deposition methods 10, 10', the only substantial difference between the two methods 10, 10' is the step 20 for depositing an interface layer 122 to the dynamic surface 120S that comprises part of the method 10. Since the broad-beam ion deposition method 10' has utility for articles 120 formed from material compositions that are not subject to deposited-carbon diffusion, the dynamic surfaces 120S of such articles 120 do not require an interface layer 122.

Figure 5A:
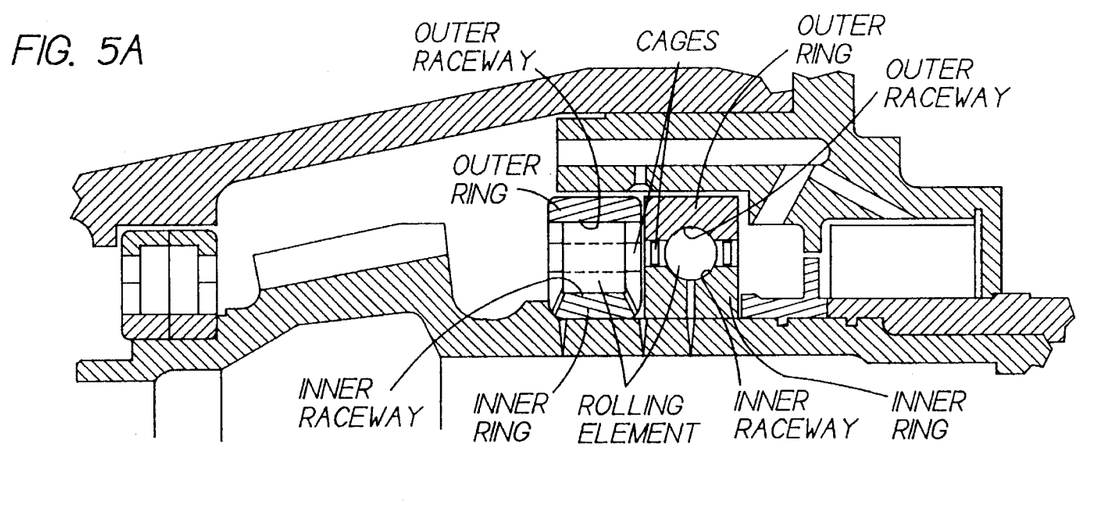
FIG. 5A is a partial cross-sectional view of a cylindrical roller/split angular contact ball bearing combination bearing assembly as an exemplary application for the broad-beam ion deposition coating methods according to the present invention.

Current helicopter designs produced by the assignee of the present invention utilize a cylindrical roller/split angular contact ball bearing combination bearing assembly (see FIG. 5A) as the production bearing assemblies for power transmission subsystems, e.g., the main transmission gearbox. The cylindrical rollers, contact ball bearings, the cages, and the inner and outer rings including the raceways of such bearing assemblies are typically formed from iron alloys. For example, the assignee of the present invention utilizes bearing assemblies wherein Pyrowear 53 iron alloy (Pyrowear 53 is a surface-carburized steel manufactured by Carpenter Technology) is utilized to fabricate the cylindrical rollers and contact ball bearings of production bearing assemblies for helicopter power transmission subsystems while the inner and outer raceways are fabricated of AISI 52100 steel.

One design constraint for the RAH-66 Comanche helicopter requires that the power transmission gearboxes have the capability to maintain flight operations (albeit at reduced power levels sufficient only to sustain level flight operations) under an "oil-out" condition for sixty minutes i.e., the flow of lubricating/cooling oil to the transmission gearbox is lost. Testing of a current production bearing assembly (details discussed in further detail in the following paragraphs) revealed that such a bearing assembly was not able to meet the foregoing design constraint. The assignee of the present invention has implemented research programs to investigate alternative bearing assembly configurations and/or modifications to the current production bearing assembly that would meet the foregoing design constraint. One approach involved the substitution of ceramic functional components for the Pyrowear 53 iron alloy functional components comprising the current production bearing assembly. Another approach involved investigations into various coatings and techniques to apply such coatings to the functional elements of the current production bearing assembly to enhance the functional efficiency thereof. The latter approach led to the broad-beam ion deposition coating methods 10, 10' according to the present invention for depositing DLC coatings on the dynamic surfaces of the current production bearing assembly.

To demonstrate the efficacy of the broad-beam ion deposition coating methods 10 (and 10') according to the present invention, several test specimens of Pyrowear 53 had DLC coatings of different thicknesses deposited thereon utilizing the broad-beam ion deposition method 10 described hereinabove. The Pyrowear 53 test specimens were first mechanically polished and then thoroughly degreased in organic solvents. The prepared Pyrowear 53 test specimens were introduced into the deposition chamber 102 so that the test surfaces thereof were orthogonal to the ion beam 104B generated by the broad-beam ion gun 104, i.e., trajectory angle $\Theta = 90°$ (see FIG. 1A). The deposition chamber 102 was evacuated to a base pressure of about $2.5 \times 10^{-5}$ torr, and the Pyrowear 53 test specimens were ion-sputter cleaned with Ar+ at an accelerating energy of about 1.050 keV and a beam current density of 2.5 mA/cm². Since Pyrowear 53 is an iron-alloy, it is subject to adherence difficulties. An interface layer 122 of Si was deposited to the sputter-cleaned test specimens to a thickness of about 0.13 µm utilizing step 20 of the broad-beam ion deposition coating method 10 described hereinabove. Methane gas was utilized for Step 22 to deposit DLC coatings 124 having thicknesses of about 0.70 lµm and 1.50 µm, respectively, on the interface layers 122 of the Pyrowear 53 test specimens. The accelerating energy for step 22 was 450 eV and the beam current density was 2.5 mA/cm².

Figure 4:
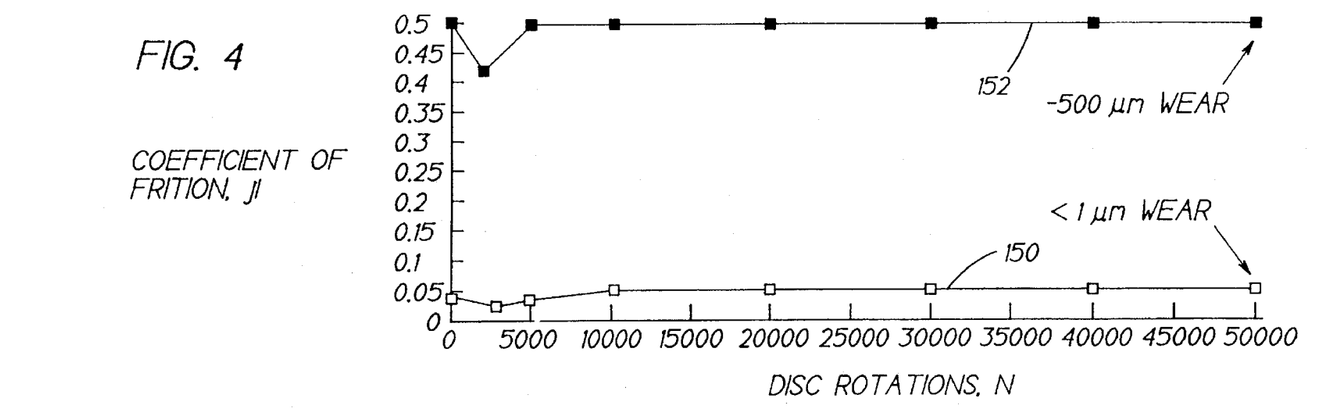
FIG. 4 is a graph contrasting the performance characteristics of an uncoated iron-alloy test specimen and an equivalent iron-alloy test specimen having a DLC coating deposited thereon utilizing the broad-beam ion deposition coating method of FIGS. 2, 2A.

The DLC-coated Pyrowear 53 test specimens were subsequently subjected to 50,000 specimen rotations in unlubricated sliding frictional contact (to simulate operation in an oil-out condition) against countersurfaces of several different types of uncoated counterbodies, including standard Pyrowear 53 counterbodies, hot-pressed $Si_3N_4$ (Norton/Cerbec's NBD 200) counterbodies (essentially a monolithic ceramic counterbody), and AISI M50 counterbodies. The test results for specific test specimens are illustrated in FIG. 4. The DLC-coated Pyrowear 53 test specimens exhibited a coefficient of friction of less than 0.05 at a contact stress of 320 ksi (reference numeral 150 in FIG. 4). In contrast, standard Pyrowear 53 specimens exhibited a coefficient of friction of about 0.5 at a contact stress of about 205 ksi (reference numeral 152). Test results indicate that the DLC-coated Pyrowear 53 test specimens have a coefficient of friction that was significantly lower than the coefficient of friction of the uncoated specimen, i.e., by a factor of ten, even though the DLC-coated Pyrowear 53 test specimens were subjected to a higher contact stress. In addition, the wear rate of the DLC-coated Pyrowear 53 test specimens was lower than the standard Pyrowear 53 specimen by a factor of seven hundred (<1 µm of wear versus about $\cong 500$ µm of wear, respectively, at the end of 50,000 specimen rotations). A slight wear track was detected in the DLC-coated Pyrowear 53 test specimens, but no detectable wear scars were observed in the uncoated counterbodies up to 500×magnification (indicating that frictional contact of an uncoated countersurface with a DLC-coated dynamic surface does not mechanically degrade the uncoated countersurface).

To further demonstrate the efficacy of the broad-beam ion deposition coating methods 10 or 10' according to the present invention for depositing a DLC coating on the dynamic surface of the current production bearing assembly for helicopter main transmission gearboxes, rig testing of several bearing assemblies in an oil-out condition was conducted. The tested bearing assemblies included a baseline cylindrical roller/split angular contact ball bearing combination bearing assembly as exemplarily illustrated in FIG. 5A (an SB-1231 bearing assembly wherein the functional components thereof are fabricated of Pyrowear 53), a modified baseline bearing assembly having monolithic, hot pressed $Si_3N_4$, i.e., ceramic, rolling elements substituted for the Pyrowear 53 roller bearing elements, and a modified baseline bearing assembly having DLC-coated inner and outer raceways utilizing the broad-beam ion deposition coating method 10 described hereinabove. While only the inner and outer raceways of the DLC-modified bearing assembly were DLC coated for rig testing, one skilled in the art will appreciate that, alternatively, the cylindrical rollers and split angular contact ball bearings can be DLC coated, or that both the inner and outer raceways and the rollers and ball bearings can be DLC coated.

Rig testing protocol involved heating the lubricating oil flow (about 0.6 GPM) to a nominal bearing assembly operating temperature of about 121° C. (250° F.) while subjecting the running bearing assembly (14,400 RPMs) to partial loading (2250/2750 lbs). As soon as the lubricating oil stabilized at the nominal operating temperature, the oil flow was terminated and the lubricating oil was drained from the gearbox to simulate an oil-out condition.

Figure 5B:
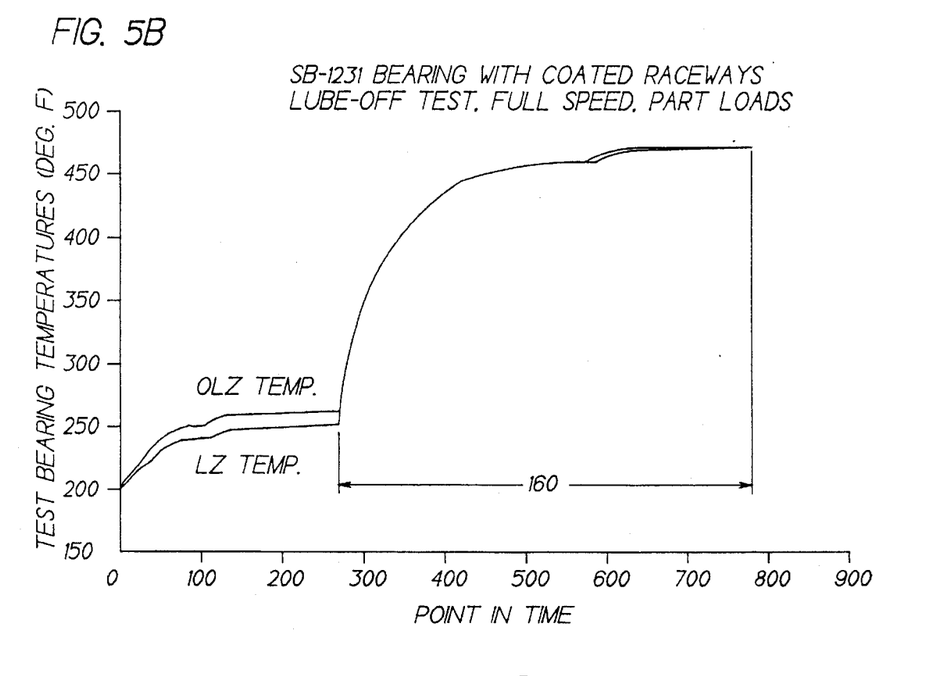
FIG. 5B is a graph illustrating the operating performance of a DLC-coated bearing assembly of the type illustrated in FIG. 5A in an oil-out condition.

The baseline bearing assembly failed after only two minutes of operation in the oil-out condition. The modified baseline bearing assembly incorporating $Si_3N_4$ roller bearing elements exhibited a time-to-failure of approximately twenty-two minutes. The failures of the baseline bearing assembly and the ceramic-modified bearing assembly were attended by thermal instabilities within the power transmission subsystem. The DLC-modified bearing assembly, in contrast, operated successfully for a full sixty minutes in an oil-out condition. FIG. 5B illustrates the time/temperature profile for the DLC-modified bearing assembly during the rig testing protocol, with the successful operating period of the DLC-modified bearing period indicated by reference numeral 160. At about t=292, the lubricating oil flow was terminated, at which point the temperature of the DLC-modified bearing assembly began rising. The highest temperature achieved by the DLC-modified bearing assembly was about 243° C. (470° F.). While this is higher than the nominal bearing assembly operating temperature, i.e., about 121° C. (250° F.) such a temperature is within acceptable limits for a bearing assembly operating in a helicopter main transmission gearbox.

While the foregoing examples illustrate the efficacy and superiority of a DLC coating deposited on a cylindrical roller/split angular contact ball bearing combination bearing assembly utilizing the broad-beam ion deposition coating method 10 according to the present invention, one skilled in the art will appreciate that the methods 10, 10' described herein have utility for depositing DLC coatings to other types of bearing assemblies. For example, the broad-beam ion deposition coating methods 10, 10' according to the present invention have utility for depositing DLC coatings to one or more contact surfaces of other types of bearing assemblies having utility in helicopter applications, e.g., a cylindrical roller bearing assembly having a spherical thrust shoulder, a high speed tapered roller bearing assembly, and/or a single row, angular contact spherical roller bearing assembly. One skilled in the art will also appreciate that the broad-beam ion deposition coating methods 10, 10' according to the present invention are not limited to bearing assemblies utilized in helicopter applications. The broad-beam ion deposition coating methods 10, 10' according to the present invention also have utility for depositing DLC coatings on the dynamic surfaces of bearing assemblies having utility in other diverse applications.

Figure 6A:
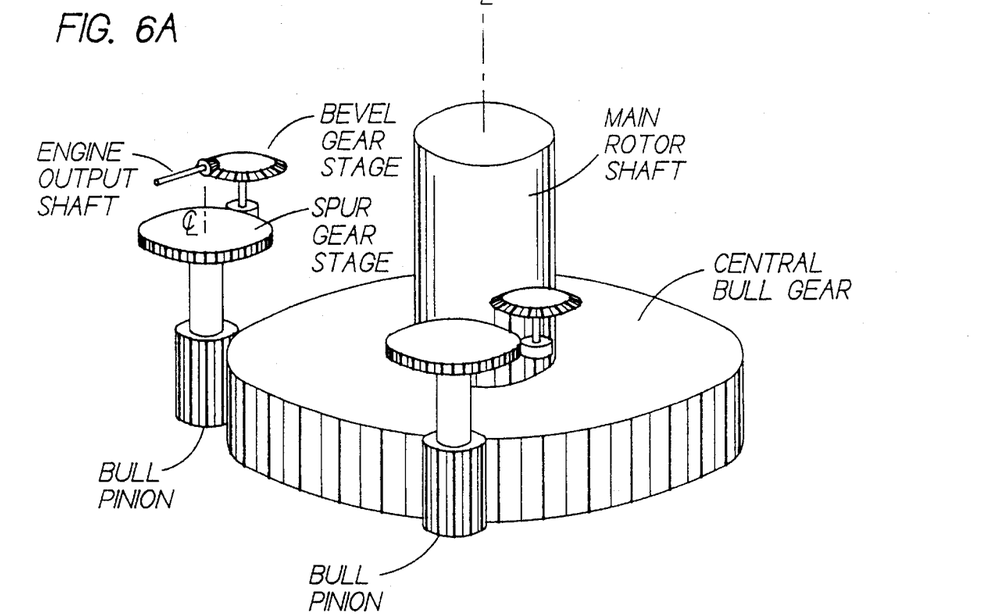
FIGS. 6A, 6B, 6C depict an exemplary helicopter three stage reduction gear train, a cross-sectional view of an S-76® (S-76 is a registered trademark of the Sikorsky Aircraft Division of United Technologies Corporation) main transmission gearbox, and a partial-perspective view of the gear teeth of a typical gear train, respectively, as another exemplary application for the broad-beam ion deposition coating methods according to the present invention.
Figures 6B, 6C:
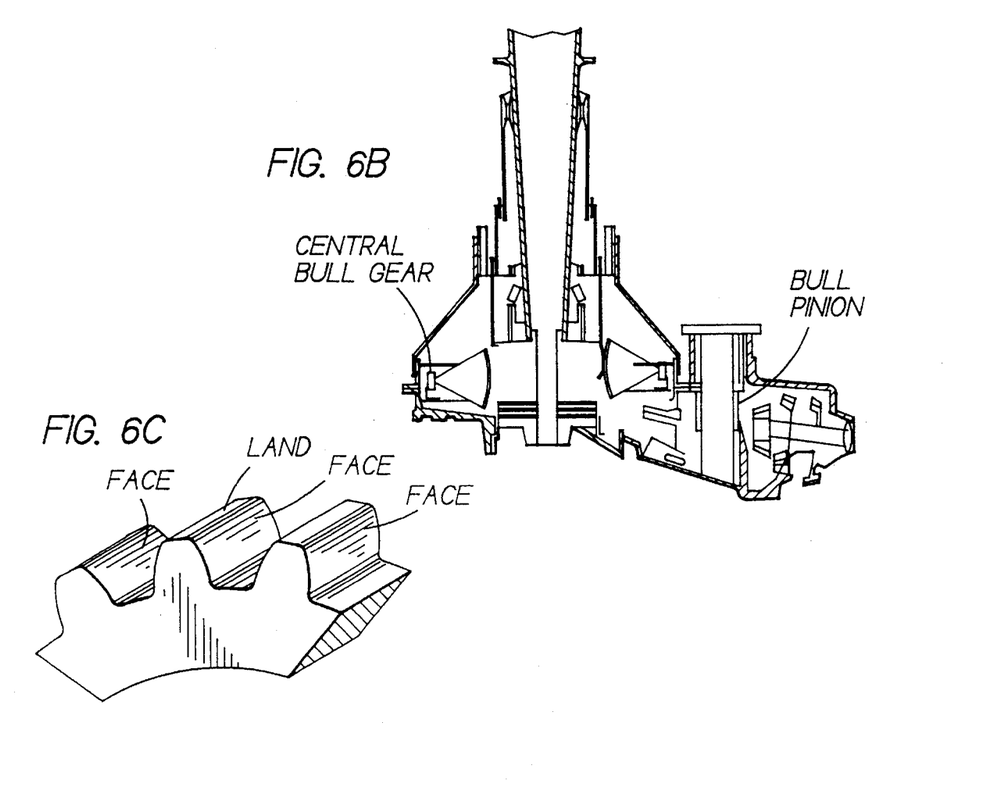

Furthermore, the broad-beam ion deposition coating methods 10, 10' according to the present invention have utility for depositing DLC coatings on the frictional contact surfaces of the involute gear teeth of the various intermeshing gear trains of a helicopter main transmission gearbox. In addition to significantly reducing the coefficient of friction and enhancing the hardness and wear resistance of involute gear teeth by depositing a DLC coating on the frictional contact surfaces thereof, DLC coatings deposited on such gear teeth may attenuate unwanted, deleterious noise generated by the intermeshing gears of the helicopter main transmission gearbox. FIG. 6A illustrates an exemplary three stage reduction gear train for a helicopter main transmission gearbox, FIG. 6B is a cross-sectional view of an S-76® (S-76 is a registered trademark of the Sikorsky Aircraft Division of United Technologies Corporation) helicopter main transmission gearbox, and FIG. 6C is a partial perspective view of exemplary gear teeth for the gear trains depicted in FIGS. 6A, 6B. With reference to FIG. 6C, the faces, i.e., dynamic surfaces 120S, of respective intermeshing gear teeth, e.g., the gear teeth of the central bull gear and the bull pinion as illustrated in FIG. 6B, may be DLC-coated utilizing the broad-beam ion deposition coating method 10 described hereinabove (the gears of current production S-76® gear trains are generally fabricated from iron-alloys) to enhance the hardness and wear resistance thereof, thereby improving the functional lifetime of such intermeshing gears. One skilled in the art will appreciate that only the faces of the gear teeth of one or the other of the intermeshing gears need be coated (the lands of the gear teeth do not experience frictional contact in intermeshing gear trains), or alternatively, that the faces of the gear teeth of both intermeshing gears may be DLC-coated. The spatial orientation between the faces of the gear teeth to be coated and the ion-beam 104B will be angled, i.e., trajectory angle $\Theta < 90°$, to accommodate the shadowing caused by the adjacent gear tooth (see description in the following paragraphs vis-a-vis the rolling die for a more detailed explication of the shadowing phenomenon). For intermeshing gear trains of the type described, the land surfaces thereof do not require a DLC-coating inasmuch such land surfaces do not experience mechanically engagement during the intermeshing of the respective gear teeth.

The broad-beam ion deposition coating methods 10, 10' according to the present invention also have utility in depositing DLC coatings on the dynamic surface 120S of manufacturing tooling to increase the hardness and wear resistance thereof, thereby increasing tool lifetimes by reducing tooling failures due to fatigue, fracture, and/or wear. Moreover, the enhanced adhesion characteristics of the DLC-coated surface 120S of manufacturing tooling effectively eliminates workpiece contamination due to microscopic breakdown of the manufacturing tooling during the fabrication process. Furthermore, the lubricity of the DLC-coated dynamic surface 120S effectively eliminates the need for process lubricants in metal forming processes due to the reduction of metal-forming forces during such processes as a result of the enhanced lubricity of the DLC-coated dynamic surface 120S of such tooling, thereby effectively eliminating the contaminating effects of such process lubricants.

Figure 7A:
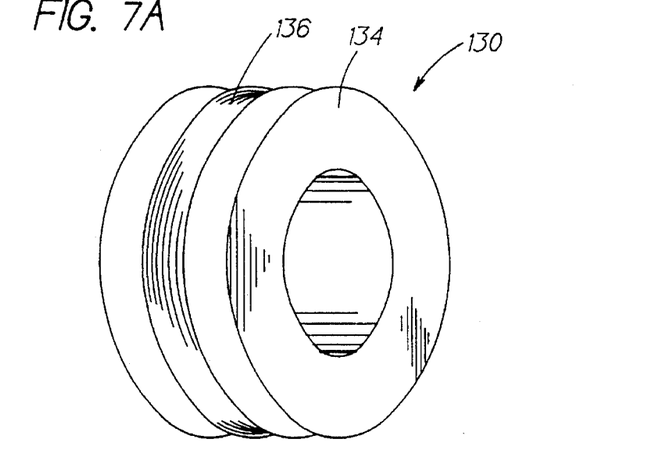
FIGS. 7A, 7B and 7C illustrate a rolling die for forming detailed heat transfer surfaces in a workpiece as yet another exemplary application for the broad-beam ion deposition coating methods according to the present invention.
Figure 7B:
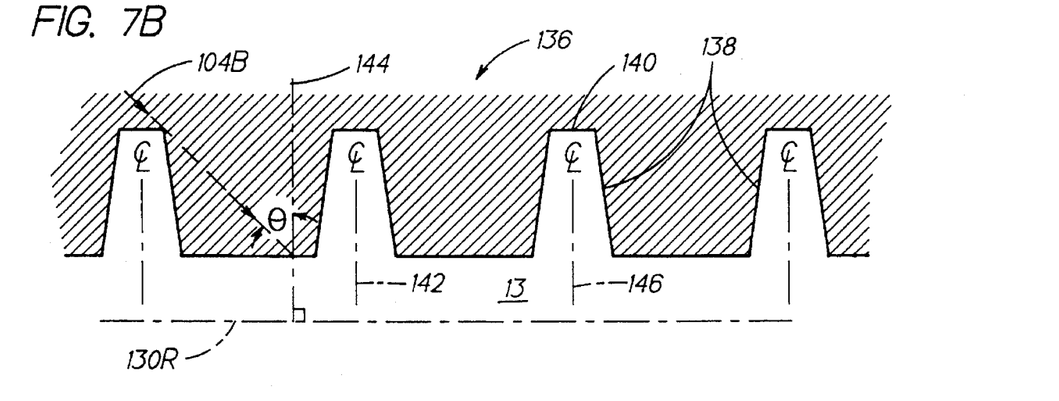
Figure 7C:
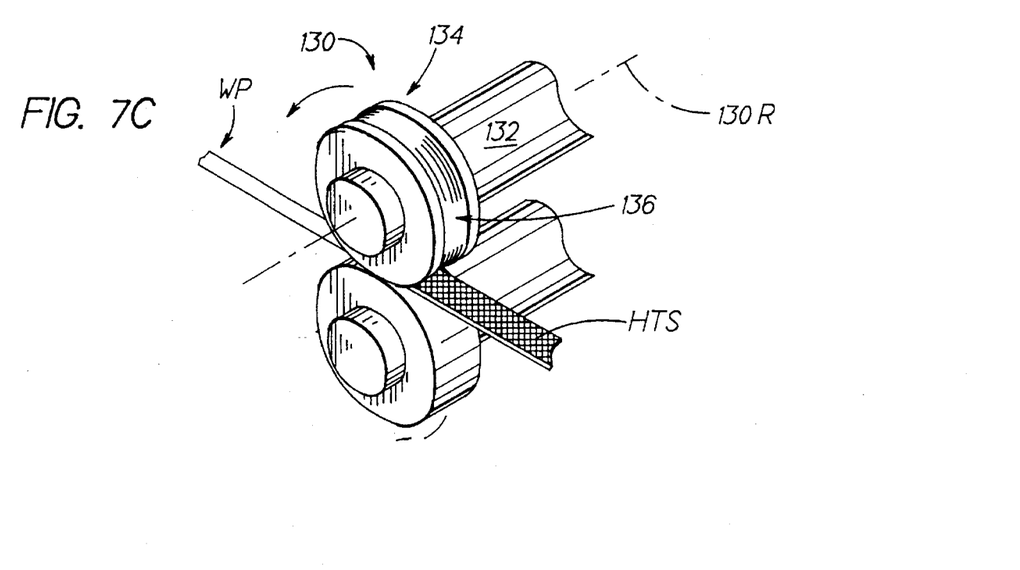

For example, the broad-beam ion deposition coating methods 10, 10' according to the present invention may be utilized to deposit a DLC coating on the dynamic surface 120S of a rolling die 130 as exemplarily illustrated in FIGS. 7A–7C. The rolling die 130 illustrated is fabricated from AISI D2 (an iron-alloy) quenched and tempered to a Rockwell hardness between 60 and 62. The rolling die 130 is operative to act upon a workpiece WP comprising a thin sheet of copper material to form detailed heat transfer surfaces HTS therein for the subsequent fabrication of heat exchanger tubing for air conditioners (see FIG. 7C). The rolling die 130, illustrated in FIG. 7A, is configured for mounting on a shaft 132 so as to be operative for rotation about the centerline of the rotational shaft, i.e., the rotational axis 130R, as illustrated in FIG. 7C. The rolling die 130 includes a head 134 having a plurality of microstructures 136 formed therein. Each microstructure 136 has a configuration that includes opposed tapered flank surfaces 138 and an intermediate land surface 140 (see FIG. 7B). The opposed flank surfaces 138 and intermediate land surfaces 140 of the plurality of microstructures 136 frictionally interact with the copper workpiece WP to form the detailed heat transfer surfaces HTS therein.

An examination of FIG. 7B shows that the plurality of microstructures 136 is arranged on the periphery of the head 134 of the rolling die 130 so that the centerlines 142 of the individual microstructures 136 are perpendicular to the rotational axis 130R. To effectively deposit the DLC coating on the flank and land surfaces 138 140 of the individual microstructures 136 (the combination of the individual flank and land surfaces 138, 140 of the plurality of microstructures 136 comprise the dynamic surface 120S) utilizing the broad-beam ion deposition coating methods 10, 10' according to the present invention, the trajectory angle $\Theta$ of the ion beam 104B may be set at an angle $\Theta$ of about 30° with respect to a line 144 perpendicular to the rotational axis 130R of the rolling die 130 to accommodate the particular geometry of the microstructures 136 of the rolling die 130. For the particular rolling tool described and illustrated herein, it has been determined that if the trajectory angle Θ is much less than 30°, the adherence characteristics of the DLC coating may be degraded due to the acuteness of the trajectory angle Θ of the ion beam 104B. Moreover, highly acute trajectory angles Θ for the ion beam 104B reduce the rate at which DLC coatings grow during ion beam deposition. If the trajectory angle Θ is greater than 30°, a given flank surface 138 of a microstructure being coated will be shadowed by the flank, land surfaces 138, 140 of the immediately adjacent microstructure 136, i.e., the ion beam 104B will impact the flank, land surfaces 138, 140 of the immediately adjacent microstructure 136, such that DLC coating will not be deposited to the entire flank surface 138.

One skilled in the art will appreciate that the optimum trajectory angle Θ of the ion beam 104B for the dynamic surface 120S of a given article 120 will depend upon the specific structural configuration of the dynamic surface 120S to be coated, as well as the interrelationship with adjacent dynamic surfaces and/or non-dynamic surfaces. It will be further appreciated that the trajectory angle Θ may be a changing variable during implementation of the broad-beam ion deposition coating methods so as to continually maintain the trajectory angle Θ in an optimized orientation with respect to the dynamic surface 120S to achieve enhanced DLC coating adherence characteristics. In connection with this, one skilled in the art will appreciate that it may be necessary to move the article 120 during the broad-beam ion deposition coating methods 10, 10' described to ensure proper coating of the dynamic surface 120S. For example, the rolling die 130 described hereinabove must be rotated about the rotational axis 130R (as well as linearly translated along the rotational axis 130R) to ensure proper deposition of DLC coatings to the flank, land surfaces 138, 140 of all the annular microstructures 136.

To demonstrate the efficacy of the broad-beam ion deposition coating methods according to the present invention in connection with manufacturing tooling such as the rolling die 130 described hereinabove, test specimens of AISI D2 (the traditional material composition for fabricating the rolling die 130) had a DLC coating deposited thereto utilizing the broad-beam ion deposition method 10 described hereinabove. The AISI D2 test specimens were thoroughly degreased with organic solvents (1-1-1 trichloroethane, acetone, and methanol in sequence) to remove handling and machining oils, deposited and spatially orientated (trajectory angle Θ=90° for the test specimens) in the deposition chamber 102 which was then evacuated as described in steps 12–16 above, and sputter cleaned with Ar+ ions having an acceleration energy of about 1.050 KeV and a beam current density of about 2.5 mA/cm$^2$ as per ion sputtering conditioning step 18. Interface layers 122 of elemental silicon and amorphous Si:C:H were deposited to respective test specimens per step 20, and DLC coatings 124 of varying thicknesses were deposited on the interface layers 122 per step 22. Accelerating energies of 450 eV and beam current densities of 2.5 mA/cm$^2$ were used for steps 20, 22. The relevant characteristics of the respective DLC-coated AISI D2 test specimens are presented in Table I.

TABLE I

| Specimen | Interface layer Compostion | Interface layer Thickness (μm) | DLC Coating Thickness (μm) | Critical Load, $L_C$ (N) |
|---|---|---|---|---|
| 1 | Si | 0.1 | 1.0 | 12/9 |
| 2 | Si | 0.2 | 1.0 | 16/14 |
| 3 | a-Si:C:H | 0.1 | 1.0 | 18/18 |
| 4 | Si | 0.1 | 1.5 | 14/6.5 |
| 5 | Si | 0.1 | 0.75 | 10/7 |
| 6 | Si | 0.1 | 1.0 | 16/5–20 |
| 7 | Si | 0.1 | 1.0 | 11–18/8 |
| 8 | a-Si:C:H | 0.1 | 1.0 | 16.5/15 |
| 9 | a-Si:C:H | 0.2 | 1.0 | 16.5/16 |
| 10 | a-Si:C:H | 0.1 | 1.0 | 18/10 |
| 11 | a-Si:C:H | 0.1 | 0.75 | 19/18 |
| 12 | a-Si:C:H | 0.1 | 1.5 | 7/4 |

The adhesion characteristics of the foregoing DLC-coated test specimens were investigated using a commercially available scratch adhesion device manufactured by Centre Suisse d'Electronique et de Microtechnique, S.A. of Neuchatel, Switzerland (marketed in the United States by Microphotonics, Inc., Allentown, Pa). The scratch adhesion device is utilized extensively by the scientific community and industry to measure the adhesive characteristics of coatings applied to metallic substrates. The device includes sensors to measure normal and frictional forces, depth of penetration, and acoustic energy.

The critical parameter to be measure vis-a-vis adhesion characteristics is the critical force, $L_C$, which is defined as the minimum force required to effectuate either adhesive or cohesive failure of the DLC-coated test specimens. Critical load testing was conducted using progressive, i.e., linearly increasing, loading applied by means of a Rockwell "C" indenter (200 μm radius of curvature) from 0N to 30N at a loading rate of 30 N/min and a stage translation rate of 10 mm/min. A total of eight scratch traverses per specimen were used, four parallel to and four perpendicular to the grinding direction of the test specimen, represented by the first and second sets of numbers, respectively, in the fifth column of Table I.

As a general rule, higher critical forces, $L_C$, indicate enhanced adhesion characteristics. An examination of Table I indicates that enhanced adhesion characteristics were exhibited by test specimens having an deposited interface layer 122 of amorphous Si:C:H of thickness of 0.1 μm and a deposited DLC coating 124 having a thickness within the range of 0.75 lμm to 1.0 μm.

Based upon the foregoing test results, it has been determined that articles having a DLC-coated dynamic surface that exhibits a critical load $L_C$ capability equal to or greater than about 16.5N/15N (parallel/perpendicular) during scratch adhesion testing possesses enhanced adhesion characteristics. The DLC-coated dynamic surfaces of such articles are suitable for a wide variety of diverse engineering applications, e.g., mechanical devices and manufacturing tools of the type described hereinabove. Such dynamic surfaces exhibit increased lubricity (low coefficient of friction), enhanced wear resistance, and high hardness during engineering application operations, thereby improving the overall efficiency and reliability of the DLC-coated article.

Raman spectroscopy is another important technique in the characterization of diamond compacts and DLC coatings due to its sensitivity to the presence of both diamond and non-diamond phases. For this reason, this technique is used extensively in the study of synthetic diamond and DLC coatings. For example, Raman spectroscopy has been used extensively in the study of the disorder and crystallite formation in carbon materials and has been employed extensively to study the properties of amorphous carbon films (a-C and a-C:H), the properties of which can vary from graphite-like to diamond-like.

Figure 8:
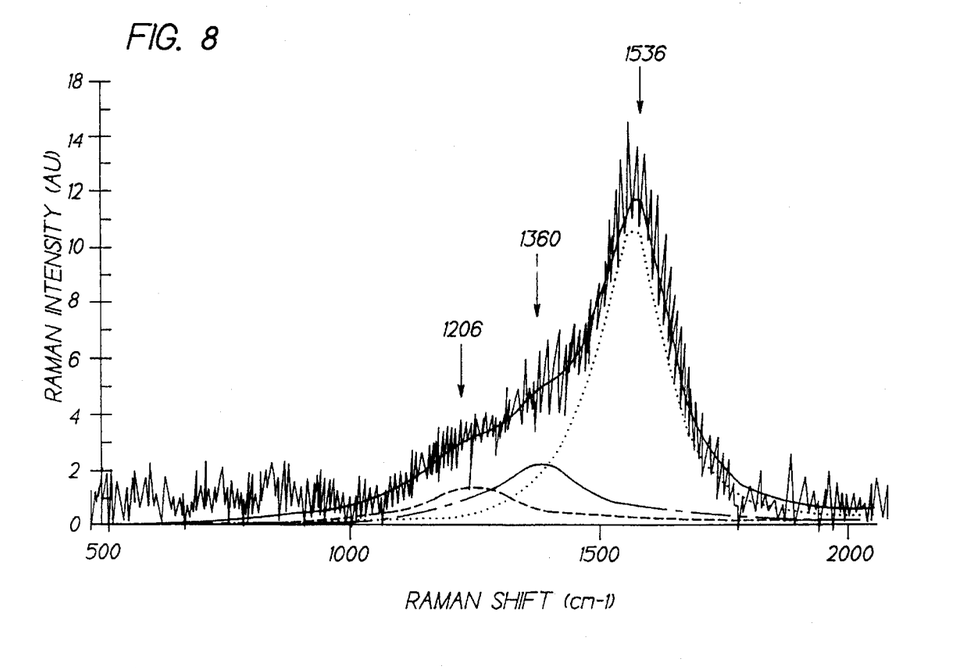
FIG. 8 is the Raman spectrum for a test specimen having a DLC coating deposited thereon utilizing the broad-beam ion deposition coating method of FIG. 2.

Shown in FIG. 8 is the Raman spectrum for a DLC-coated test specimen. The test specimen was fabricated from AISI M50 steel and DLC coated using the broad-beam ion deposition coating method 10 described hereinabove at an accelerating potential of 260 eV and a beam current density of 2.5 mA/cm$^2$. The interface layer 122 was a-Si:C:H and the DLC coating 124 had a thickness of 1.0 μm. The DLC-coated test specimen had an indentation hardness of 9.30 GPa, an indentation modulus of 74.03 GPa, and a critical load $L_C$ capability of 18N/18.5N. The spectrum can be deconvoluted into three contributions as illustrated, with features centered at 1206, 1360, and 1536 cm$^{-1}$. The band at 1360 cm−1 is in agreement with the disordered "D" band seen in disordered graphites, the band centered at 1536 cm−1 represents the "G" band which is shifted slightly in frequency, and the band at 1206 cm−1 has been observed by others but not explicitly discussed. These three spectral features were common to all of the DLC coatings that were deposited on the dynamic surfaces 120S of articles 120 as described hereinabove. Only small variations in the Raman spectra have been observed as a result of variations in ion deposition energy over the range of 260 eV to 677 eV.

A variety of modifications and variations of the present invention are possible in light of the above teachings. It is therefore to be understood that, within the scope of the appended claims, the present invention may be practiced otherwise than as specifically described herein.

What is claimed is:

1. A broad-beam ion deposition coating method for depositing a diamond-like-carbon coating indirectly to a dynamic surface of an article subject to adherence difficulties utilizing a broad-beam ion deposition apparatus, the broad-beam ion deposition apparatus including a deposition chamber, a broad-beam ion gun operative to generate an ion beam having a trajectory, vacuum means for evacuating the deposition chamber, gas supply means for supplying gas to the broad-beam ion gun and the deposition chamber, and a target interposable between the broad-beam ion gun and the dynamic surface, comprising the steps of:

(A) preliminarily conditioning the dynamic surface of the article for broad-beam ion deposition;

(B) inserting the conditioned article within the deposition chamber wherein the dynamic surface is spatially orientated at a predetermined trajectory angle with respect to the ion beam trajectory;

(C) evacuating the deposition chamber to a predetermined base pressure utilizing the vacuum means;

(D) ion sputtering conditioning the dynamic surface of the article for broad-beam ion deposition by (D1) providing a sputtering gas to the broad-beam ion gun utilizing the gas supply means, (D2) operating the broad-beam ion gun to ionize the sputtering gas to generate a sputtering ion beam having a predetermined beam current density, and (D3) accelerating the sputtering ion beam at a predetermined accelerating energy towards the dynamic surface wherein impact of the accelerated sputtering ion beam with the dynamic surface effectuates sputter cleaning thereof.

(E) depositing an interface layer having a predetermined thickness on the dynamic surface by (E1) providing a first gas to the broad-beam ion gun utilizing the gas supply means, (E2) operating the broad-beam ion gun to ionize the first gas to generate a first ion beam having a predetermined beam current density, and (E3) accelerating the first ion beam towards the target at a predetermined accelerating energy to dislodge atoms therefrom, the dislodged atoms being deposited on the dynamic surface to form the interface layer on the dynamic surface; and (F) depositing a diamond-like-carbon coating having a predetermined thickness on the interface layer deposited on the dynamic surface by (F1) providing a carbon-based gas to the broad-beam ion gun utilizing the gas supply means, (F2) operating the broad-beam ion gun to ionize the carbon-based gas to generate a second ion beam that includes carbon ions, the second ion beam having a predetermined beam current density, and (F3) accelerating the second ion beam towards the dynamic surface at a predetermined accelerating energy wherein the carbon ions of the second ion beam are deposited on the interface layer to form the diamond-like-carbon coating for the dynamic surface of the article.

2. The method of claim 1 wherein the predetermined beam current density of the first ion beam of step (F2) is within the range of about 1.5 mA/cm$^2$ to about 3.5 mA/cm$^2$.

3. The method of claim 1 wherein the predetermined beam current density of the first ion beam of step (E2) is about 2.5 mA/cm$^2$.

4. The method of claim 1 where the predetermined accelerating energy for the first ion beam of step (E3) is within the range of about 1.00 keV to about 1.20 keV.

5. The method of claim 1 where the predetermined accelerating energy for the first ion beam of step (E3) is about 1.05 keV.

6. The method of claim 1 wherein the predetermined beam current density of the second ion beam of step (F2) is within the range of about 1.5 mA/cm$^2$ to about 3.5 mA/cm$^2$.

7. The method of claim 1 wherein the predetermined beam current density of the second ion beam of step (F2) is about 2.5 mA/cm$^2$.

8. The method of claim 1 where the predetermined accelerating energy for the second ion beam of step (F3) is within the range of about 200 eV to about 1000 eV.

9. The method of claim 1 where the predetermined accelerating energy for the second ion beam of step (F3) is within the range of about 450 eV to about 700 eV.

10. The method of claim 1 where the predetermined accelerating energy for the second ion beam of step (F3) is about 450 eV.

11. The method of claim 1 wherein the first gas supplied in step (E1) is argon gas and wherein the target is formed of silicon such that the interface layer deposited on the dynamic surface is a silicon interface layer.

12. The method of claim 1 wherein step (E1) further includes providing methane gas at a predetermined partial pressure to the deposition chamber, and further wherein the target is formed from silicon such that the interface layer deposited on the dynamic surface is an amorphous silicon-:carbon:hydrogen interface layer.

13. The method of claim 1 wherein the predetermined partial pressure of the methane gas provided in step (E1) is about $1.5\times10^{-4}$ torr.

14. The method of claim 1 wherein the predetermined thickness of the interface layer deposited on the dynamic surface in step (E3) is within the range of about 0.10 μm to about 0.15 μm.

15. The method of claim 1 wherein the predetermined thickness of the diamond-like-carbon coating deposited to the interface layer in step (F3) is within the range of about 0.50 μm to about 2.0 μm.

16. The method of claim 1 wherein the predetermined thickness of the diamond-like-carbon coating deposited to the interface layer in step (F3) is within the range of about 0.70 μm to about 1.5 μm.

17. The method of claim 1 wherein the predetermined beam current density of the sputtering ion beam of step (D2) is within the range of about 1.5 mA/cm$^2$ to about 3.5 mA/cm$^2$.

18. The method of claim 1 wherein the predetermined beam current density of the sputtering ion beam of step (D2) is about 2.5 mA/cm$^2$.

19. The method of claim 1 wherein the predetermined accelerating energy of the sputtering ion beam of step (D3) is within the range of about 1.00 keV to about 1.20 keV.

20. The method of claim 1 wherein the predetermined accelerating energy of the sputtering ion beam of step (D3) is about 1.05 keV.

21. The method of claim 1 wherein the predetermined base pressure of the evacuated deposition chamber in step (C) is not greater than $3\times10^{-5}$ torr.

22. The method of claim 1 wherein the predetermined base pressure of the evacuated deposition chamber in step (C) is about $2.5\times10^{-5}$ torr.

23. The method of claim 1 wherein the preliminary conditioning step (A) comprises mechanically preparing the dynamic surface for broad-beam ion deposition.

24. The method of claim 1 wherein the preliminary conditioning step (A) comprises chemical cleaning of the dynamic surface for broad-beam ion deposition.

25. The method of claim 1 wherein the preliminary conditioning step (A) comprises the substeps of:
   (A1) mechanically conditioning of the dynamic surface for broad-beam ion deposition; and
   (A2) chemically cleaning the dynamic surface for broad-beam ion deposition.

26. A broad-beam ion deposition coating method for depositing a diamond-like-carbon coating directly to a dynamic surface of an article not subject to adherence difficulties utilizing a broad-beam ion deposition apparatus, the broad-beam ion deposition apparatus including a deposition chamber, a broad-beam ion gun operative to generate an ion beam having a trajectory, vacuum means for evacuating the deposition chamber, and gas supply means for supplying gas to the broad-beam ion gun and the deposition chamber, comprising the steps of:

(A) preliminarily conditioning the dynamic surface of the article for broad-beam ion deposition;
   (B) inserting the conditioned article within the deposition chamber wherein the dynamic surface is spatially orientated at a predetermined trajectory angle with respect to the ion beam trajectory;
   (C) evacuating the deposition chamber to a predetermined base pressure utilizing the vacuum means;
   (D) ion sputtering conditioning the dynamic surface of the article for broad-beam ion deposition by
      (D1) providing a sputtering gas to the broad-beam ion gun utilizing the gas supply means,
      (D2) operating the broad-beam ion gun to ionize the sputtering gas to generate a sputtering ion beam having a predetermined beam current density, and
      (D3) accelerating the sputtering ion beam at a predetermined accelerating energy towards the dynamic surface wherein impact of the accelerated sputtering ion beam with the dynamic surface effectuates sputter cleaning thereof; and
   (E) depositing a diamond-like-carbon coating having a predetermined thickness to the dynamic surface by
      (E1) providing a carbon-based gas to the broad-beam ion gun utilizing the gas supply means,
      (E1) providing a carbon-based gas to the broad-beam ion gun utilizing the gas supply means,
      (E2) operating the broad-beam ion gun to ionize the carbon-based gas to generate an ion beam that includes carbon ions, the ion beam having a predetermined beam current density, and
      (E3) accelerating the ion beam towards the dynamic surface at a predetermined accelerating energy wherein the carbon ions of the ion beam are deposited on the dynamic surface to form the diamond-like-carbon coating for the dynamic surface of the article.

27. The method of claim 26 wherein the predetermined beam current density of the ion beam of step (E2) is within the range of about 1.5 mA/cm$^2$ to about 3.5 mA/cm$^2$.

28. The method of claim 26 wherein the predetermined beam current density of the ion beam of step (E2) is about 2.5 mA/cm$^2$.

29. The method of claim 26 wherein the predetermined accelerating energy for the ion beam of step (E3) is within the range of about 200 eV to about 1000 eV.

30. The method of claim 26 wherein the predetermined accelerating energy for the ion beam of step (E3) is within the range of about 450 eV to about 700 eV.

31. The method of claim 26 wherein the predetermined accelerating energy for the ion beam of step (E3) is about 450 eV.

32. The method of claim 26 wherein the predetermined thickness of the diamond-like-carbon coating deposited on the dynamic surface in step (E3) is within the range of about 0.50 μm to about 2.0 μm.

33. The method of claim 26 wherein the predetermined thickness of the diamond-like-carbon coating deposited on the dynamic surface in step (E3) is within the range of about 0.70 μm to about 1.5 μm.

34. The method of claim 26 wherein the predetermined beam current density of the sputtering ion beam of step (D2) is within the range of about 1.5 mA/cm$^2$ to about 3.5 mA/cm$^2$.

35. The method of claim 26 wherein the predetermined beam current density of the sputtering ion beam of step (D2) is about 2.5 mA/cm$^2$.

36. The method of claim 26 wherein the predetermined accelerating energy of the sputtering ion beam of step (D3) is within the range of about 1.00 keV to about 1.20 keV.

37. The method of claim 26 wherein the predetermined accelerating energy of the sputtering ion beam of step (D3) is about 1.05 keV.

38. The method of claim 26 wherein the predetermined base pressure of the evacuated deposition chamber in step (C) is not greater than 3×10$^{-5}$ torr.

39. The method of claim 26 wherein the predetermined base pressure of the evacuated deposition chamber in step (C) is about 2.5×10$^{-5}$ torr.

40. The method of claim 26 wherein the preliminary conditioning step (A) comprises mechanically conditioning the dynamic surface for broad-beam ion deposition.

41. The method of claim 26 wherein the preliminary conditioning step (A) comprises chemical cleaning of the dynamic surface for broad-beam ion deposition.

42. The method of claim 26 wherein the preliminary conditioning step (A) comprises the substeps of:

(A1) mechanically conditioning the dynamic surface for broad-beam ion deposition; and (A2) chemically cleaning the dynamic surface for broad-beam ion deposition.

* * * * *